(12) United States Patent
Daryoush et al.

(10) Patent No.: US 11,791,608 B2
(45) Date of Patent: Oct. 17, 2023

(54) COMPACT HIGHLY-STABLE SYNTHESIZED RF SOURCES USING SELF MODE-LOCKED BEAT-NOTES OF MULTI-MODES LASERS

(71) Applicant: Drexel University, Philadelphia, PA (US)

(72) Inventors: Afshin S. Daryoush, Bryn Mawr, PA (US); Tianchi Sun, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 846 days.

(21) Appl. No.: 16/757,786

(22) PCT Filed: Oct. 23, 2018

(86) PCT No.: PCT/US2018/057188
§ 371 (c)(1),
(2) Date: Apr. 21, 2020

(87) PCT Pub. No.: WO2019/084069
PCT Pub. Date: May 2, 2019

(65) Prior Publication Data
US 2021/0226416 A1    Jul. 22, 2021

Related U.S. Application Data

(60) Provisional application No. 62/576,398, filed on Oct. 24, 2017.

(51) Int. Cl.
*H01S 5/065* (2006.01)
*H01S 5/026* (2006.01)
(Continued)

(52) U.S. Cl.
CPC ............ *H01S 5/0657* (2013.01); *H01S 5/026* (2013.01); *H01S 5/06821* (2013.01);
(Continued)

(58) Field of Classification Search
CPC .......................... H01S 5/06821; H01S 5/0656
(Continued)

(56) References Cited

U.S. PATENT DOCUMENTS 5,265,116 A   11/1993   Mooradian
5,828,688 A   10/1998   Cook et al.
(Continued)

FOREIGN PATENT DOCUMENTS

WO    2019/084069 A1    5/2019

OTHER PUBLICATIONS

International Search report and Written Opinion received for PCT Application No. PCT/US2018/057188, dated Jan. 4, 2019, 12 pages.

*Primary Examiner* — Tuan N Nguyen
(74) *Attorney, Agent, or Firm* — Schott, P.C.

(57) ABSTRACT

Low phase noise signal generated in a small structure is required for communication and high-resolution imaging. A DBR based multi-mode laser is combined with mode-locking method to build frequency stabilized and tunable RF signal generator. The number of the output modes from each laser is adjusted using reflecting bandwidth of distributed Bragg reflector and electro-absorption (EA) modulator for amplitude control, while the phase section in integrated laser system provides frequency tuning. Mode-locking of 60 laser modes results in a highly frequency stable 10 GHz RF beat-notes with a calculated phase noise of −150 dBc/Hz at 10 kHz offset frequency.

18 Claims, 3 Drawing Sheets

(51) Int. Cl.
  *H01S 5/068* (2006.01)
  *H01S 5/125* (2006.01)
  *H01S 5/343* (2006.01)
  *H01S 5/40* (2006.01)

(52) U.S. Cl.
  CPC .......... *H01S 5/125* (2013.01); *H01S 5/34306* (2013.01); *H01S 5/4068* (2013.01)

(58) Field of Classification Search
  USPC .......................................................... 372/20
  See application file for complete search history.

(56) References Cited

U.S. PATENT DOCUMENTS

| | | |
|---|---|---|
| 6,081,361 A | 6/2000 | Adams et al. |
| 7,564,561 B2 | 7/2009 | Peng |
| 7,873,079 B2 | 1/2011 | Arahira |
| 8,050,558 B2 | 11/2011 | Otani et al. |
| 8,687,665 B1 | 4/2014 | Tauke-Pedretti et al. |
| 8,953,937 B2 | 2/2015 | Sartorius et al. |
| 2002/0093995 A1 | 7/2002 | Tayebati |
| 2004/0036943 A1* | 2/2004 | Freund ................ G02F 1/01708 359/240 |
| 2007/0248299 A1* | 10/2007 | Welch ................ G02B 6/12007 385/14 |
| 2009/0196314 A1 | 8/2009 | Duncan |
| 2014/0199065 A1 | 7/2014 | Bratkovski et al. |
| 2017/0047708 A1 | 2/2017 | Johnson |

* cited by examiner

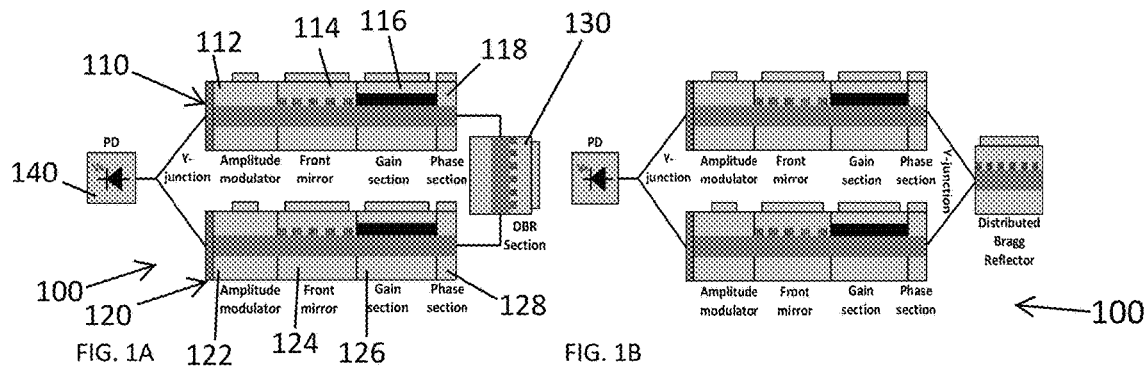
FIG. 1A    FIG. 1B
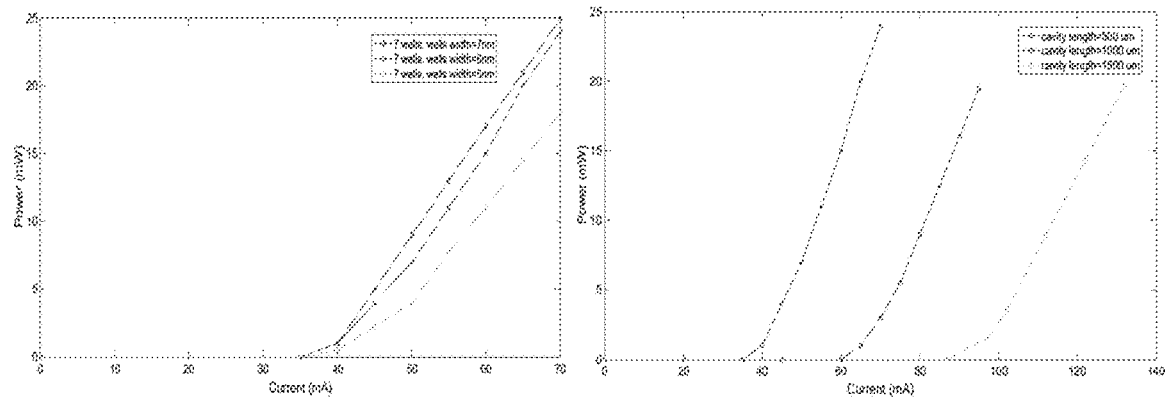
FIG. 2A    FIG. 2B
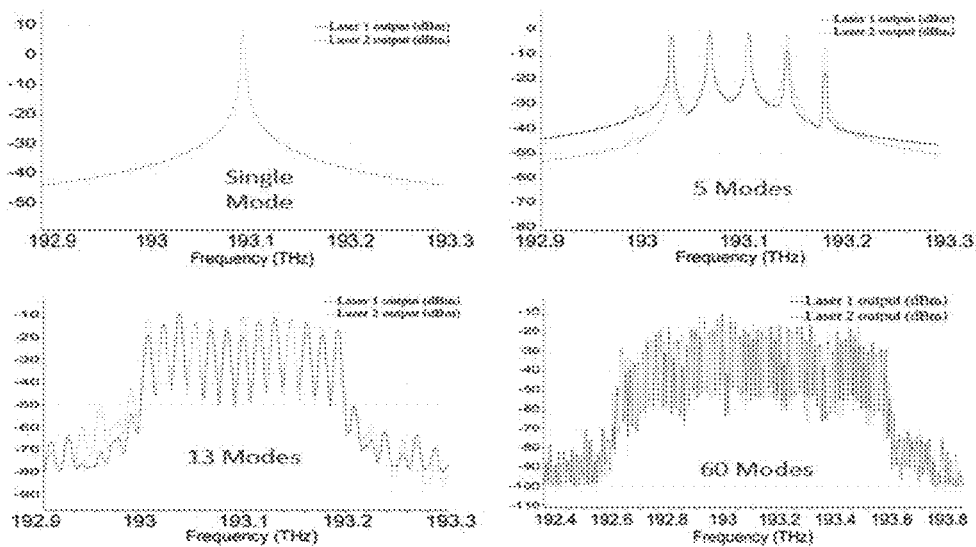
FIG. 3A    FIG. 3B
FIG. 3C    FIG. 3D

COMPACT HIGHLY-STABLE SYNTHESIZED RF SOURCES USING SELF MODE-LOCKED BEAT-NOTES OF MULTI-MODES LASERS

BACKGROUND

Tunable signal sources with high frequency stability are called frequency synthesizers and used in many modern systems, such as custom analog and digital radio receivers communication, instrumentation, remote sensing, navigational, and imaging systems. Classic frequency synthesizers at low RF frequencies are electronic circuits that generate a range of RF frequencies from a single stable frequency reference by employing nonlinear conversion and control loop subsystems. A frequency synthesizer may use the techniques of frequency multiplication, frequency division, direct digital synthesis, frequency mixing with free-running oscillation and then phase-locking loops to generate its highly stable frequencies. The stability and accuracy of the frequency synthesizer's output are related to the stability and accuracy of its reference frequency input. Consequently, synthesizers use stable and accurate reference frequencies, such as those provided by crystal oscillators.

Classic frequency synthesizer phase noise performance relies on external reference and may reach approximately −80 dBc/Hz at offset 10 kHz for X-band operation. This phase noise performance is poor for many applications, however, such as high-resolution imaging, sample and hold digitizers, and satellite communication systems. In addition, the output frequency of classic signal generator may be limited by a YIG-filter and RF amplifier, which are integrated in the synthesizer system, as a tunable oscillator. Thus, it become challenging for a classic synthesizer to serve for high speed telecommunications (such as 5G telecommunications), which require high RF frequencies (above 1 GHz) with estimated demand up to 350 GHz for THz communication and medical imaging.

Stable and high frequency RF signal generation is important in next generation telecommunication systems. Therefore, a fully integrated topology of opto-electronic components, delay elements, and DBR segment using concepts of hybrid, heterogenous, or monolithic integration in Si photonics will reduce fabrication cost, while significantly reducing size.

SUMMARY OF THE EMBODIMENTS

Chip level multi-mode lasers generate beat-notes at radio frequencies but may suffer from poor phase noise characteristics unless cavity length is increased to result in narrow linewidth. To address this poor close-in to carrier phase noise, forced oscillations may be combined with monolithically integrated devices.

The laser set-up may include 4 major sections including distributed Bragg reflector (DBR), gain medium, phase tuning section and electro-absorption modulator.

The distributed Bragg reflector may be used as a filter to select laser output frequency. When increasing reflection band, DBR based multi-mode laser may provide more modes with appropriate frequency separation decided by cavity length. Two lasers pairs will share one DBR (DBR section) using either Y-junction as co-propagating laser modes or a counter propagating colliding mode configuration in our design. Meantime, in order to minimize the effects introduced by shared DBR, the length of DBR may be increased to about 6 mm for a higher spectral content.

Gain medium may use InGaAsP—InAsP multi quantum well structure for operation at about 1550 nm, where a threshold current of about 30 mA is estimated for multimode lasers using 7 wells of 5-7 nm wide and gain section length of 500 um to 1500 um.

Phase tuning section in the laser set up may work for frequency tuning, which may function as the phase modulator in the DBR laser. Different DC bias voltages may be applied to drive different output frequency from each multimode laser. The output of from multi-mode laser may be through either standard mirror or a MIR structure that is partially coupled to delay lines and partially to Y-junction combiner. The delayed version may be used for forced oscillation using self-active mode-locking, while the other outputs of two multi-mode lasers may be coupled using Y-junction and then provide input to a high-speed photodetector for efficient detection of the ultra-stable beat-notes RF signal.

The electro-absorption modulator may be integrated in the simulation set-up, where effective absorption coefficient is changed per both wavelength and biasing voltage. The electro-absorption amplitude modulator may be applied to effectively control the number of output laser modes using its different absorption rate.

This design may use two multi-mode lasers that share a DBR section and the design uses phase and amplitude modulations to adjust the beat-note frequency and the number of laser modes. A tunable RF signal may use this generation design.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 1A and 1B show conceptual representations of monolithically integrated multi-mode lasers using RF beat-notes generation laser system.

FIGS. 2A and 2B shows expected physical modeling of different multi-quantum well laser structure using SILVACO simulations.

FIGS. 3A-3D show the expected performance of multi-mode laser output using different DBR frequency separation to control available modes in two multi-mode lasers; 3A) single-mode, 3B) 5 modes, 3C) 13 modes, and 3D) 60 modes.

DETAILED DESCRIPTION OF ILLUSTRATIVE EMBODIMENTS

Figure 4A:
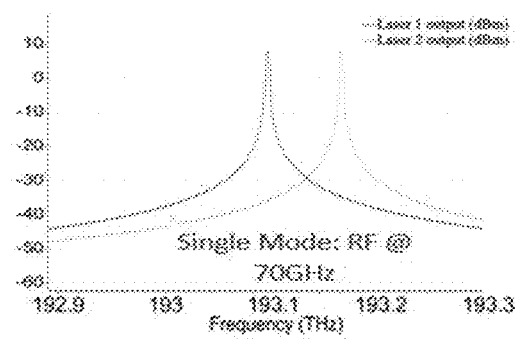
FIGS. 4A-4D show the expected performance of multi-mode laser output using phase tuning for different DBR bandwidth and selected frequency beats; 4A) single-mode, 4B) 5 modes, 4C) 13 modes, and 4D) 60 modes.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any sub-combination. Further, reference to values stated in ranges include each value within that range.

Device and Method

As shown in FIGS. 1A and 1B show co-propagating versus counter propagating, which are two different methods of mode-locking. The disclosed method and system 100 are in the field of devices for RF signal generator using two monolithically integrated multi-mode lasers that have separate sections 110, 120 joined at Y junctions, with each section 110, 120 having amplitude modulation 112, 122, mirror, 114, 124, integrated gain 116, 126, and phase 118, 128 components. FIG. 1A shows benefits of a counter propagating mode-locked laser using space saving of the bi-directional characteristic of Bragg reflector. This realized procedure and its reflected feedback won't affect each other. FIG. 1B shows a structure using co-propagating provides another design direction which synchronize the feedback from the distributed Bragg reflector and its related mode locking circuit that could be simplified by applying it to one laser.

The mirror components 114, 124 may use either standard facet or Multimode Interference Reflector (MIR) in one side but share a broadband distributed Bragg reflector (DBR) section 130 as common reflector. The multi-mode laser is self-mode locked to achieve a tunable radio frequency (RF) source with high stability, as local oscillator for variety of applications. The multi-mode laser source could be realized using II-VI and III-V semiconductor material that cover wavelengths from visible to near infra-red (IR) region of optical spectrum. A photodiode 140 may be integrated into the laser diode package and produce a current proportional to an output laser diode optical power.

Free-running oscillators using high quality factors, such as dielectric resonator oscillators (DRO), may work as a fixed frequency oscillator with low phase noise performance. In order to further reduce phase noise, a new system may involve any forms of forced oscillation, such as injection locking phase locking (ILPLL) in modular or integrated subsystems techniques, to reduce free-running phase noise levels. Such an approach replaces the conventional external reference sources at frequencies above 10 GHz. Forced injection locking (IL) and forced phase lock loop (PLL) may function as feedback control loops to adjust instantaneous signal. This control system reduces close-in to carrier phase noise and associated timing jitters of optical pulses of a tunable source as reference signal. Such a system and method may replace the need for external reference, when a delayed signal is used as external reference.

A compact version may be based on multi-mode laser system. Practical telecommunication lasers may be designed for low optical loss wavelength of about 1550 nm (frequency of hundred THz level) and can be used to generate high frequency RF signal, while for any application realization could be in wavelengths of 300 nm to 1700 nm. The beat-note of two mixed laser sources may output frequency between couple of GHz to THz level. Meanwhile, a forced oscillation of ILPLL or SILPLL could be combined with active mode locking techniques in a monolithically integrated fixed frequency separation multi-mode laser pairs, with a gain profile that may support many modes at the same time depending on free spectral range of long optical cavity of lasing sections and gain profile of multi-quantum well structure. In this way, with increasing modes number involved in mixing process, the phase noise of the system may be significantly reduced.

Thus, using the beat-notes of DBR based multi-mode laser pairs provide a way to resolve both increasing frequency need and lower phase noise requirement. Optical frequency output is much higher comparing with RF signal, so with appropriate injection current tuning on laser phase section, 1% frequency shift can result in THz level beat-notes output. Meantime, appropriate fixed phase multi-modes output will contribute to reduce the phase noise because the noise won't be cascaded while beat-notes output is increasing.

Adding the phase modulation component could tune the dominant laser wavelength of each multi-mode laser and hence could result in broadband tunable RF signals.

A distributed Bragg reflector selects the laser oscillation frequency. The DBR bandwidth relies on the reflective index of different layers while the frequency separation is decided by laser cavity length.

DBR may be designed using several high-low index films. The thickness for each layer is $t_H=\lambda/(4n_H)$ and $t_L=\lambda/(4n_L)$ respectively while the total length is 6 mm.

The optimized design parameters are applied to system level design software Lumerical Interconnect (from Lumerical Solution, Inc.) for the configuration shown in FIG. 1. Both of these two diagrams give the same purpose of using shared distributed Bragg reflector where FIG. 1A will need one more Y-junction when compared with FIG. 1B.

These FIGS. 1A and 1B depict conceptual representation of monolithically integrated multi-mode lasers using RF beat-notes generation laser system using DBR based multi-modes laser pairs. The designs are based on counter propagating as a colliding pulse laser or a co-propagating mode using the Y-junction combiner.

Model Results

FIGS. 2A and 2B show expected physical modeling of different multi-quantum well laser structure using SILVACO simulations. FIG. 2A shows the threshold current variation of well width under certain wells number and laser cavity length. FIG. 2B shows the cavity length impact of laser threshold current while wells number and width are kept the same.

The bandwidth of the DBR may be first designed a 200 GHz frequency as shown in FIGS. 3A-3D, which show the simulation results under different mode gaps. In FIG. 3A, the mode gap is setting up for 250 GHz, so other modes are outside a passing band of the DBR. In this way, there will be 1 mode existing in the passing band for both lasers (they overlap each other).

FIGS. 3B and 3C show two designs for a frequency gap equal to 40 GHz and 15 GHz respectively. The DBR passband is still set at 200 GHz, with 5 modes and 13 modes separately for these two conditions.

FIG. 3D shows 60 modes for each laser by selecting a DBR bandwidth of 900 GHz with a frequency separation of 15 GHz. In the theory using beat-notes generating RF signal, the greater number of available modes will result in a more stable beat-notes.

With this particular 60 modes using an optimized DBR section design, performance of a DBR laser may be simulated by employing both a phase-tuning section and electro-absorption modulator-based amplitude control.

Output frequency tuning for each DBR laser pairs may be realized using phase modulation section and the phase section design may include a straight waveguide element and a modulator element.

The transmitted-signal-induced index change may in turn induce a modulation dependent variation in the phase of the optical signal.

The modulator and DC source may have the appearance of an electro-optic modulator and the input phase variation data with biasing voltage applied on phase tuning section (length=600 um).

With the use of the below Table 1, the frequency shift with different bias voltage can be realized.

TABLE 1

| Voltage (V) | 0 | 1 | 2 | 3 | 4 | 5 |
|---|---|---|---|---|---|---|
| Phase (degree/mm) | 0 | 34.48 | 83.54 | 144.07 | 229.07 | 325.02 |

Figure 4B:
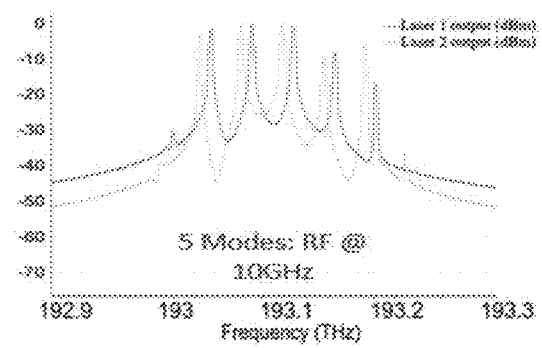
Figure 4C:
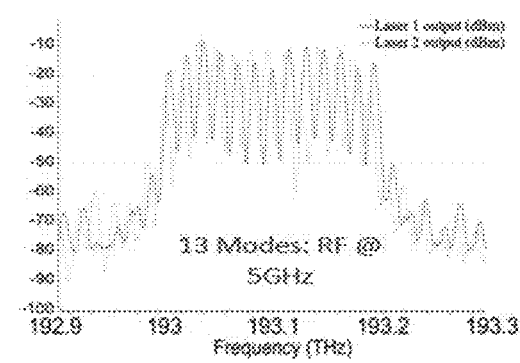
Figure 4D:
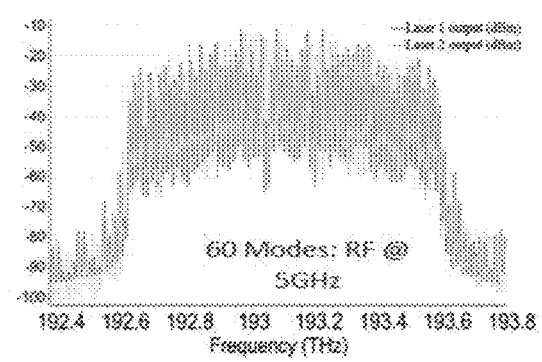
Figure 5A:
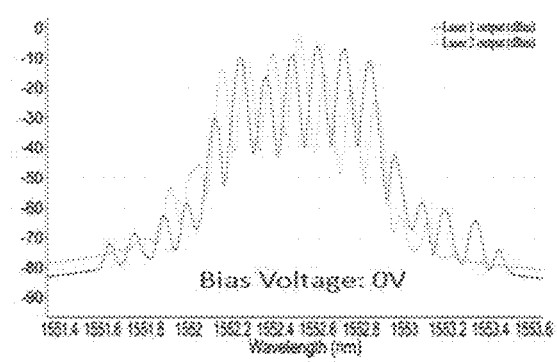
FIGS. 5A-5D show control of mode number using reverse bias voltage of electro-absorption modulator (EAM) as an amplitude modulator.
Figure 5B:
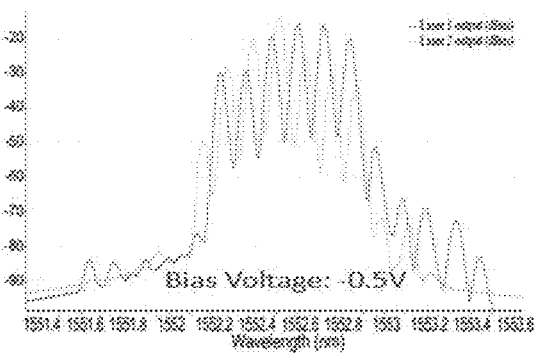
Figure 5C:
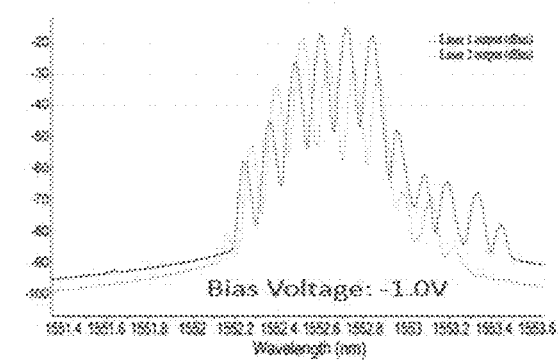
Figure 5D:
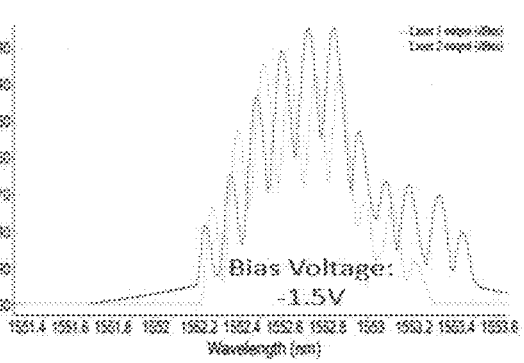

By applying different DC biasing voltage, the multi-mode laser output may shift at the same time by employing a similar design structure shown in FIGS. 1A and 1B, but for various applied DC voltage. Frequency tuning of a single mode laser may be seen in FIG. 4A with a 70 GHz optical frequency tuning and 70 GHz RF beat signal from photo-detector. For the case of 5 modes laser pairs (FIG. 4B), 10 GHz RF frequency beats are generated, while 5 GHz RF frequency beats may be generated for 13 modes and 60 modes lasers, as respectively depicted in FIG. 4C and FIG. 4D.

Mode number adjustment may be another useful function for multi-mode laser-based beat-notes generation. Integrated EA modulator (EAM) may be applied here using its different effective absorption coefficient value at different wavelength using applied voltage.

The used simulation absorption coefficient is from table below and the designed EAM length is selected to be about 20 um. Using equation below, the calculated wavelength dependent loss is applied to the multi-mode laser and render the results in Table 2.

$$I = I_o e^{-\alpha x} \quad \text{Equation 1}$$

TABLE 2

| Wavelength (nm) | 1552 | 1552.2 | 1552.4 | 1552.6 | 1552.8 | 1553 |
|---|---|---|---|---|---|---|
| Loss (−0 V) | 14.6 dB | 14.5 dB | 14.5 dB | 14.4 dB | 14.3 dB | 14.2 dB |
| Loss (−0.5 V) | 21.0 dB | 19.8 dB | 18.7 dB | 17.7 dB | 16.9 dB | 16.4 dB |
| Loss (−1 V) | 27.1 dB | 25.2 dB | 23.2 dB | 20.4 dB | 18.2 dB | 16.6 dB |
| Loss (−1.5 V) | 40.4 dB | 34.9 dB | 29.7 dB | 24.8 dB | 20.7 dB | 17.0 dB |

This simulated result is based on 6 modes multi-mode laser output. The simulation result in FIGS. 5A-5D shows modes number control performance using EAM with different reverse bias voltage; 5A) 0V, 5B) −0.5V, 5C) −1V, and 5D) −1.5V.

In order to compare RF signal characteristics using different number of modes, the frequency difference for multi-mode laser pair was set to fixed 10 GHz. The close-in to carrier phase noise at 10 GHz was then compared for different mode number cases.

Meantime, active-mode locking technique is applied on the multi-mode laser output for simulation comparison with free running result. The active mode locking for lasers share the same idea as forced ILPLL based control of free-running oscillators. IL and PLL are used to control as feedback loops where part of the output signal is delayed and used as reference signal.

The IL signal was then injected to the laser output through a circulator to provide the IL function. For the PLL function, the reference signal was compared against the non-delayed laser output to generate a phase error signal for phase and frequency locking. The low frequency phase error was detected by the 'Mixer+LPFA' board that contains a double-balanced mixer as phase detector and then the error signal went through an active filter using op-amp circuit as low pass filter amplifier (LPFA) to provide feedback to the multi-mode laser phase tuning section.

Figure 6A:
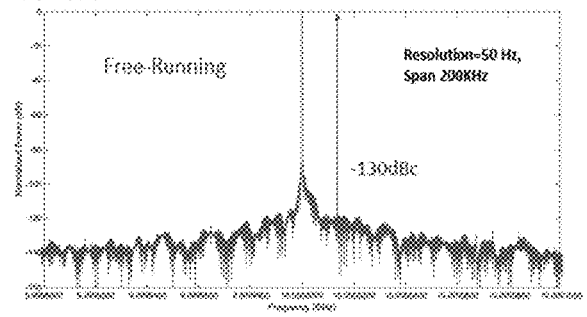
FIGS. 6A-6D show expected close-in phase noise of RF beat-notes output of multi-mode lasers with and without self-mode locking by a delayed version of optical signal with phase detector and amplitude modulation control.
Figure 6B:
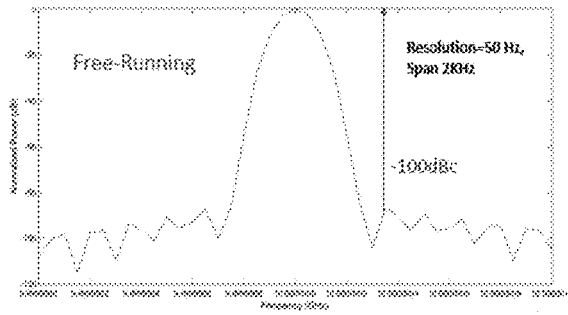
Figure 6C:
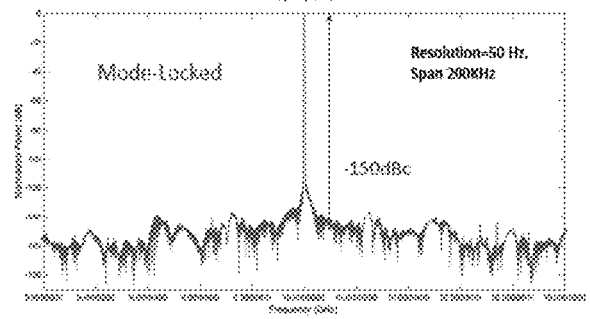
Figure 6D:
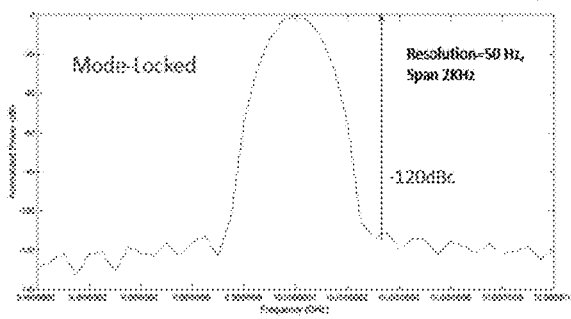

The free running and mode locking 10 GHz beat-notes simulation results are for 60 modes, as depicted in FIGS. 6A and 6C, with a frequency resolution of 50 Hz over 200 kHz frequency span. In order to check stability of close in to carrier frequency, the small span value as low as 2 kHz is also displayed in FIGS. 6B and 6D. There is no significant side mode peak appearing in the simulation, so the beat-notes RF output is stable and clean.

Other result using different modes number and the case without mode locking is also provided in Table 3 below in terms of close-in to carrier phase noise at 10 GHz.

TABLE 3

| Mode number | Free Running @ 1 KHz | Mode locking @ 1 KHz | Free Running @ 10 KHz | Mode locking @ 10 KHz |
|---|---|---|---|---|
| 1 | −100 dBc/Hz | −78 dBc/Hz | −120 dBc/Hz | −105 dBc/Hz |
| 5 | −98 dBc/Hz | −120 dBc/Hz | −120 dBc/Hz | −120 dBc/Hz |
| 13 | −90 dBc/Hz | −117 dBc/Hz | −118 dBc/Hz | −130 dBc/Hz |
| 20 | −98 dBc/Hz | −120 dBc/Hz | −120 dBc/Hz | −140 dBc/Hz |
| 60 | −105 dBc/Hz | −130 dBc/Hz | −120 dBc/Hz | −150 dBc/Hz |

The mode locking technique demonstrated reduced phase noise compared with free running laser beat-notes RF signal. The best performance is −150 dBc/Hz at offset frequency 10 kHz in mode lock condition in comparison to −120 dBc/Hz for free running beat-notes.

In addition, at small mode number value, the simulated result sometimes shows lower phase noise value when compared with large mode number phase noise performance (e.g., phase noise at offset frequency of 1 kHz is worse for mode numbers of 13 than 5 modes), especially at free running case due to its mode-partition noise.

That is because when the number of the mode is comparatively small, the beat-notes doesn't show any advantages using modest increase in mode numbers. The small difference is simply exasperated by random oscillation of each mode generated in multi-mode lasers. However, when the mode number reaches above 50, random oscillation is forced to be coherently locked to other modes, hence having a greater RF signal stability.

While the invention has been described in the attached paper and figures with reference to the embodiments described herein, a person of ordinary skill in the art would understand that various changes or modifications may be made thereto without departing from the scope of the claims.

The invention claimed is:

1. A distributed Bragg reflector (DBR] based multi-mode laser having mode-locking capability to build a frequency stabilized and tunable RF signal generator comprises: a distributed Bragg reflector (DBR] used as a filter to select laser output frequency; a gain medium;
   a phase tuning section; and
   an electro-absorption amplitude modulator;
   wherein more than one multi-mode lasers share the DBR reflector;
   wherein the gain medium is designed using InGaAsP—InAsP multi quantum well structure for operation at about 1550 nm, where a threshold current of about 30 mA is estimated for multi-mode lasers using 7 wells of 5-7 nm wide and gain section length of 500 um to 1500 um.

2. The distributed Bragg reflector (DBR) based multi-mode laser of claim 1, wherein the more than one multi-mode lasers share the DBR reflector using either Y-junction as co-propagating laser modes or a counter propagating colliding mode configuration.

3. The distributed Bragg reflector (DBR) based multi-mode laser of claim 1, wherein when increasing a reflection band, the DBR based multi-mode laser will provide a greater number of modes with appropriate frequency separation decided by cavity length.

4. The distributed Bragg reflector (DBR) based multi-mode laser of claim 1, wherein the phase tuning section functions as a phase modulator in the DBR laser.

5. The distributed Bragg reflector (DBR) based multi-mode laser of claim 1, wherein the electro-absorption amplitude modulator controls a number of output laser modes using its different absorption rate.

6. The distributed Bragg reflector (DBR] based multi-mode laser of claim 1, wherein the DBR based multi-mode laser generates beat-notes at radio frequencies with an increased cavity length resulting in a narrow linewidth.

7. The distributed Bragg reflector (DBR) based multi-mode laser of claim 6, wherein forced oscillations are combined with monolithically integrated devices.

8. The distributed Bragg reflector (DBR) based multi-mode laser of claim 6, wherein controlled phase and amplitude modulations adjust the beat-note frequency and a number of laser modes.

9. A radio frequency signal generator comprising two monolithically integrated multi-mode lasers that have separate sections joined at Y junctions, with each section having amplitude modulation, minor, integrated gain, and phase components, wherein more than one multi-mode lasers share a distributed Bragg reflector (DBR], wherein the integrated gain is designed using InGaAsP—InAsP multi quantum well structure for operation at about 1550 nm, where a threshold current of about 30 mA is estimated for multi-mode lasers using 7 wells of 5-7 nm wide and gain section length of 500 um to 1500 um.

10. The radio frequency signal generator of claim 9, wherein a beat-note of two mixed laser sources outputs frequency between a GHz to THz level.

11. The radio frequency signal generator of claim 9, wherein the phase components a dominant laser wavelength of each multi-mode laser, which allows for output of broadband tunable RF signals.

12. The radio frequency signal generator of claim 9, wherein the distributed Bragg reflector selects a laser oscillation frequency.

13. The radio frequency signal generator of claim 12, wherein a DBR bandwidth relies on a reflective index of different layers while a frequency separation is determined by a laser cavity length.

14. The radio frequency signal generator of claim 9, wherein a mode number adjustment is performed for the more than one multi-mode lasers using beatnotes generation.

15. The radio frequency signal generator of claim 9, further comprising an integrated EA modulator (EAM) that uses a different effective absorption coefficient value at different wavelength using applied voltage.

16. The radio frequency signal generator of claim 9, wherein the more than one multi-mode lasers share the DBR reflector using either of the Y-junction as co-propagating laser modes or a counter propagating colliding mode configuration.

17. The radio frequency signal generator of claim 9, wherein when increasing a reflection band, a DBR based multi-mode laser will provide a greater number of modes with appropriate frequency separation decided by cavity length.

18. The radio frequency signal generator of claim 9, wherein the phase components function as a phase modulator in the more than one multi-mode lasers.

* * * * *